(12) United States Patent
Prosyentsov et al.

(10) Patent No.: US 11,886,096 B2
(45) Date of Patent: Jan. 30, 2024

(54) ASSEMBLY INCLUDING A NON-LINEAR ELEMENT AND A METHOD OF USE THEREOF

(71) Applicant: ASML NETHERLANDS B.V., Veldhoven (NL)

(72) Inventors: Vitaliy Prosyentsov, Helmond (NL); Yongfeng Ni, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/909,223

(22) PCT Filed: Feb. 24, 2021

(86) PCT No.: PCT/EP2021/054572
§ 371 (c)(1),
(2) Date: Sep. 2, 2022

(87) PCT Pub. No.: WO2021/197716
PCT Pub. Date: Oct. 7, 2021

(65) Prior Publication Data
US 2023/0091241 A1    Mar. 23, 2023

(30) Foreign Application Priority Data
Mar. 31, 2020  (EP) ................................. 20166940

(51) Int. Cl.
*G02F 1/35*     (2006.01)
*G02F 1/365*    (2006.01)
*G03F 7/00*     (2006.01)

(52) U.S. Cl.
CPC ............ *G02F 1/3503* (2021.01); *G02F 1/365* (2013.01); *G03F 7/7015* (2013.01); *G02F 2201/34* (2013.01); *G02F 2202/32* (2013.01)

(58) Field of Classification Search
CPC ..................................................... G02F 1/3528
See application file for complete search history.

(56) References Cited

U.S. PATENT DOCUMENTS 6,747,735 B2 * 6/2004 Chen ......................... G01J 3/44
356/301
6,952,253 B2   10/2005 Lof et al.
(Continued)

FOREIGN PATENT DOCUMENTS

CN     104577683     4/2015
EP      1628164      2/2006
(Continued)

OTHER PUBLICATIONS

International Search Report and Written Opinion issued in corresponding PCT Patent Application No. PCT/EP2021/054572, dated May 7, 2021.
(Continued)

*Primary Examiner* — Rhonda S Peace
(74) *Attorney, Agent, or Firm* — Pillsbury Winthrop Shaw Pittman, LLP

(57) ABSTRACT

An assembly including a non-linear element configured for generating broadband radiation from input radiation coupled into the non-linear element. The assembly further includes an optical element positioned downstream of the non-linear element configured to reflect a fraction of the broadband radiation back into the non-linear element. The non-linear element can be a nonlinear fiber, such as a hollow-core photonic crystal fiber (HC-PCF).

21 Claims, 7 Drawing Sheets

(56) References Cited

U.S. PATENT DOCUMENTS

| | | | |
|---|---|---|---|
| 6,961,116 B2 | 11/2005 | Den Boef et al. | |
| 7,265,364 B2 | 9/2007 | Teunissen et al. | |
| 7,646,471 B2 | 1/2010 | Teunissen et al. | |
| 8,000,574 B2* | 8/2011 | Buchter | G02F 1/365 250/459.1 |
| 8,422,519 B2* | 4/2013 | Knight | G02B 6/02 372/6 |
| 9,160,137 B1* | 10/2015 | Abdolvand | H01S 3/0092 |
| 9,748,728 B2* | 8/2017 | Zhong | H01S 3/094076 |
| 10,693,271 B2* | 6/2020 | Uebel | G02F 1/355 |
| 11,099,319 B2* | 8/2021 | Uebel | G02B 6/02328 |
| 11,163,208 B2* | 11/2021 | Uebel | G02F 1/365 |
| 11,699,889 B2* | 7/2023 | Abdolvand | H01S 3/094038 372/6 |
| 2004/0015085 A1 | 1/2004 | Soh et al. | |
| 2007/0296960 A1 | 12/2007 | Den Boef et al. | |
| 2008/0198380 A1 | 8/2008 | Straaijer et al. | |
| 2009/0168062 A1 | 7/2009 | Straaijer | |
| 2009/0195768 A1 | 8/2009 | Bijnen et al. | |
| 2010/0007863 A1 | 1/2010 | Jordanoska | |
| 2010/0233600 A1 | 9/2010 | Den Boef et al. | |
| 2010/0328655 A1 | 12/2010 | Den Boef | |
| 2011/0026032 A1 | 2/2011 | Den Boef et al. | |
| 2011/0032500 A1 | 2/2011 | Straaijer | |
| 2011/0102753 A1 | 5/2011 | Van De Kerkhof et al. | |
| 2011/0102793 A1 | 5/2011 | Straaijer | |
| 2011/0188020 A1 | 8/2011 | Den Boef | |
| 2011/0249244 A1 | 10/2011 | Leewis et al. | |
| 2012/0044470 A1 | 2/2012 | Smilde et al. | |
| 2012/0044495 A1 | 2/2012 | Straaijer | |
| 2013/0162996 A1 | 6/2013 | Straaijer et al. | |
| 2013/0308142 A1 | 11/2013 | Straaijer | |
| 2014/0334763 A1* | 11/2014 | Holzer | G02F 1/3513 385/1 |
| 2015/0261097 A1 | 9/2015 | Mathijssen et al. | |
| 2016/0161863 A1 | 6/2016 | Den Boef et al. | |
| 2016/0370717 A1 | 12/2016 | Den Boef et al. | |
| 2018/0224711 A1* | 8/2018 | Chuang | G01N 21/3563 |
| 2019/0319420 A1 | 10/2019 | Uebel et al. | |
| 2023/0091241 A1* | 3/2023 | Prosyentsov | G03F 7/7015 |

FOREIGN PATENT DOCUMENTS

| | | |
|---|---|---|
| WO | 2016102127 | 6/2016 |
| WO | 2017032454 | 3/2017 |
| WO | 2018127266 | 7/2018 |

OTHER PUBLICATIONS

Achazi, G. et al.: "Reconstruction of polarization-shaped laser pulses after a hollow-core fiber using backreflection", Applied Optics, vol. 50, No. 6 (2011).

Mridha, M.K. et al.: "Dominance of backward stimulated Raman scattering in gas-filled hollow-core photonic crystal fibers", arxiv.org/ftp/arxiv/papers/1801/1801.08069.pdf (accessed on Sep. 2, 2022) (Jan. 24, 2018).

* cited by examiner

ASSEMBLY INCLUDING A NON-LINEAR ELEMENT AND A METHOD OF USE THEREOF

CROSS-REFERENCE TO RELATED APPLICATIONS

This application is the U.S. national phase entry of PCT Patent Application No. PCT/EP2021/054572 which was filed on Feb. 24, 2021, which claims priority of European Patent Application No. 20166940.5 which was filed on Mar. 31, 2020 and which is incorporated herein in its entirety by reference.

FIELD

The present invention relates to an assembly including a non-linear element and a method of use thereof. More particularly, the non-linear element is configured for generating broadband radiation from input radiation coupled into the non-linear element.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In relation to lithography applications, many different types of measurements may be performed, both within a lithographic apparatus and external to the lithographic apparatus. Generally, such measurements may be performed by apparatus using a radiation source to irradiate a measurement target, and a detection system operable to measure at least one property of a portion of the incident radiation scattered from the target. Examples of a measurement apparatus external to a lithographic apparatus include a metrology apparatus and an inspection apparatus. A metrology apparatus may return data relating to one or more properties of a substrate, wherein data may be quantitative data. An inspection apparatus may detect defects or imperfections on a substrate. Examples of measurement systems inside a lithographic apparatus include topography measurements, position measurements, and alignment measurements, for measuring properties of patterns on a substrate.

The quality of measurements may affect the quality of the lithographic process they are associated with. One of the elements that may affect the quality of the measurements is the quality of the radiation used in the measurements.

Different types of radiation may be used to interrogate different properties of a substrate.

Radiation sources (e.g. using a hollow core photonic crystal fibre) may have low efficiency. For example, up to 40% of the pump power (i.e. input radiation) may come out of the fibre along with generated radiation (i.e. broadband radiation). Ideally, the input radiation should be converted in the fibre, and only a small fraction of it come out of the fibre.

The radiation source may generate radiation in an unpredictable way governed by e.g. the radiation source itself. A single shot generation process itself is chaotic, governed by the quantum noise in the system, thus is not limited to the radiation source. In this sense, it is not possible to control the single shot spectrum and not possible to influence the spectrum coming from the radiation source. The spectral performance of the radiation source may be degrading without a means to compensate for it, or modify the spectrum.

SUMMARY

According to a first aspect of the present invention, there is provided an assembly comprising a non-linear element configured for generating broadband radiation from input radiation coupled into the non-linear element, wherein the assembly further comprises an optical element positioned downstream of the non-linear element configured to reflect a fraction of the broadband radiation back into the non-linear element.

This may have an advantage of increasing the broadband radiation generated from the same amount of input radiation and increasing effective energy conversion efficiency. Furthermore, this may have an advantage of reducing the length of the non-linear element. The noise performance of the system may also be improved.

The non-linear element may broaden the wavelength spectrum of the input radiation to provide broadband output radiation.

The optical element may be configured to reflect at least some radiation at or near the wavelength or wavelengths of the input radiation back into the non-linear element. The fraction of the broadband radiation may be the radiation at or near the wavelength or wavelengths of the input radiation. That is, un-depleted input (pump) radiation. The input radiation may comprise a single wavelength, a plurality of discrete wavelengths, or a narrowband wavelength range.

The optical element may be configured to provide pulse compression functionality for the at least some radiation at or near the wavelength or wavelengths of the input radiation. This may have an advantage of increasing the intensity of the reflected un-depleted input radiation to initiate the non-linear process generating the broadband radiation. The compression of the input radiation pulses may be by phase modulation.

The optical element may be configured to transmit at least some of the broadband radiation. The optical element may be a transmission element. The broadband radiation may comprise the input radiation. The broadband radiation may be supercontinuum radiation.

The optical element may be configured to transmit between 90% to 100% of the broadband radiation excluding the fraction of the broadband radiation reflected. The optical element may be configured to transmit substantially 100% of the broadband radiation excluding the fraction of the broadband radiation reflected.

The assembly may further comprise an additional optical element positioned between the non-linear optical element and the optical element, the additional optical element may be configured to transmit at least some broadband radiation and to reflect at least some radiation at or near the wavelength or wavelengths of the input radiation to the optical element and back from the optical element into the non-linear optical element. The optical element may be a reflective element. The additional optical element may be a dichroic mirror. The optical element may comprise a chirped mirror, a grating pair, or a prism pair.

The additional optical element may be configured to transmit between 90% and 100% of the broadband radiation excluding the fraction of the broadband radiation reflected. The additional optical element may be configured to transmit substantially 100% of the broadband radiation excluding the fraction of the broadband radiation reflected.

The optical element may be configured to reflect between 90% and 100% of the radiation at or near the wavelength or wavelengths of the input radiation.

The optical element may be configured to reflect a majority of the broadband radiation back into the non-linear element. The majority of the broadband radiation may comprise the input radiation. The broadband radiation may be the generated broadband radiation. The reflected broadband radiation may generate further broadband radiation in the non-linear element. The optical element may be a reflective element.

The optical element may be a transmission element. The optical element may be configured to transmit at least some of the broadband radiation. The optical element may be configured to transmit up to 10% of the broadband radiation.

The optical element may be configured to reflect between 90% to 100% of the broadband radiation.

The assembly may comprise a supplementary optical element positioned upstream of the non-linear element configured to reflect at least some broadband radiation off axis and transmit at least some of the radiation at or near the wavelength or wavelengths of the input radiation. The supplementary optical element may reflect the broadband radiation away from the non-linear element.

The assembly may comprise an upstream optical element positioned upstream of the non-linear element configured to reflect at least some of the broadband radiation back into the non-linear element. The upstream optical element may transmit input radiation. The upstream optical element may be configured to reflect between 90% to 100% of the broadband radiation.

The assembly may comprise an upstream additional optical element positioned between the non-linear optical element and the upstream optical element, the upstream additional optical element may be configured to transmit at least some radiation at or near the wavelength or wavelengths of the input radiation and to reflect at least some broadband radiation to the upstream optical element and back from the upstream optical element into the non-linear optical element. The upstream optical element may be a reflective element. The upstream additional optical element may be a dichroic mirror. The upstream additional optical element may reflect between 90% and 100% of the broadband radiation.

The upstream optical element may be configured to shape pulses of the broadband radiation. This may have an advantage of allowing the average spectrum coming from the non-linear element to be influenced and compensating for degraded spectral performance. The broadband radiation may be manipulated based on requirements of applications. Dynamic elements (e.g. for pulse shaping or pulse compressing) may be changed during operation.

The upstream optical element may be configured for spectral filtering purposes; filtering particular frequencies out of the broadband radiation.

The assembly according to any preceding claim, wherein the assembly comprises a first lens and a second lens positioned upstream and downstream of the non-linear element respectively for focussing radiation into the non-linear element and providing substantially collimated radiation exiting the non-linear element. The downstream optical element may comprise a spectral filter or an acousto-optic tunable filter.

The assembly may comprise at least one actuator configured to move at least one of the optical element, the additional optical element, the upstream optical element, the upstream additional optical element, the supplementary optical element, the first lens and the second lens. The actuator may enable the radiation to enter the non-linear element. There may be a separate actuator for each component.

The non-linear element may be a hollow core fibre.

The hollow core fibre may be a photonic crystal fibre.

According to a second aspect of the present invention, there is provided a metrology arrangement comprising an assembly as detailed above.

According to a third aspect of the present invention, there is provided a metrology apparatus comprising the metrology arrangement as detailed above.

According to a fourth aspect of the present invention, there is provided an inspection apparatus comprising the metrology arrangement as detailed above.

According to a fifth aspect of the present invention, there is provided a lithographic apparatus comprising the assembly as detailed above.

According to a sixth aspect of the present invention, there is provided a lithographic apparatus comprising the metrology arrangement as detailed above.

According to a seventh aspect of the present invention, there is provided a method of generating broadband radiation from input radiation coupled into a non-linear element, the method comprising: reflecting a fraction of the broadband radiation back into the non-linear element from an optical element positioned downstream of the non-linear element.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
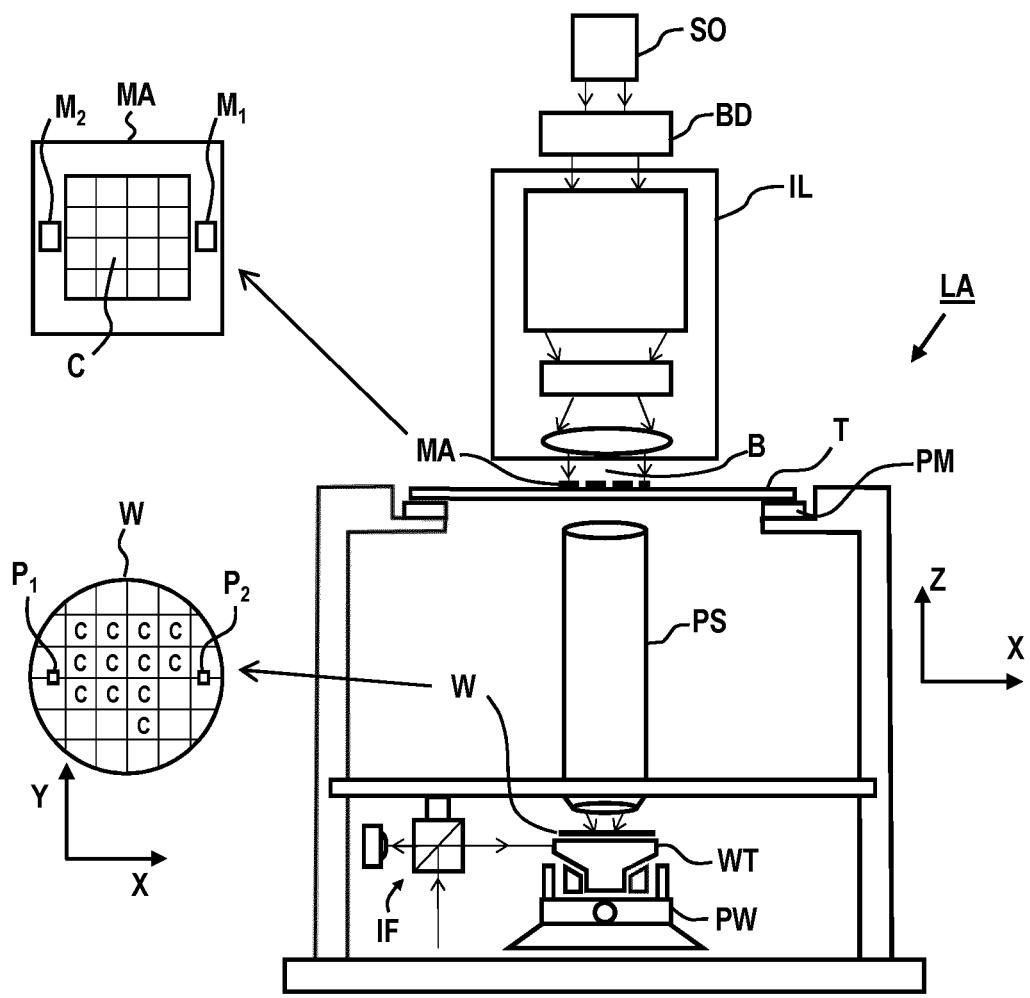
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
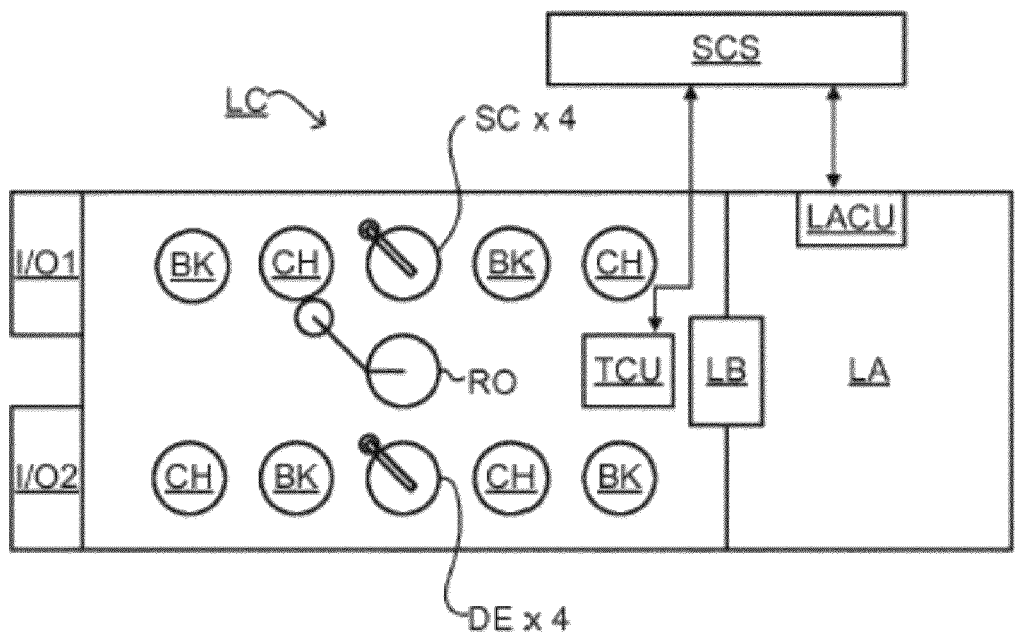
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
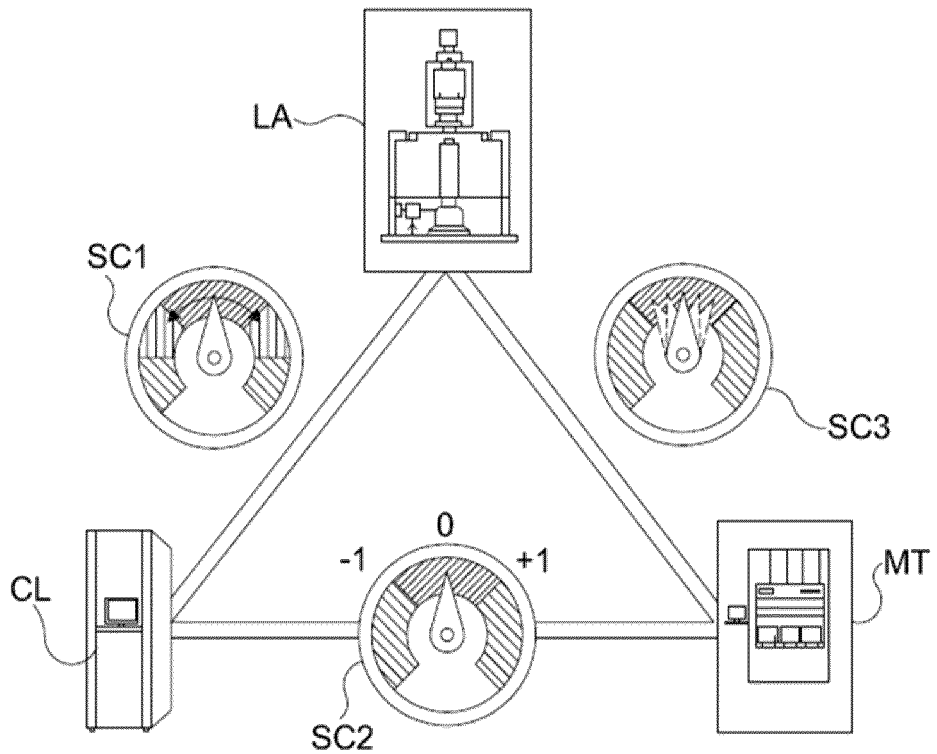
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT.

Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is a ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 4:
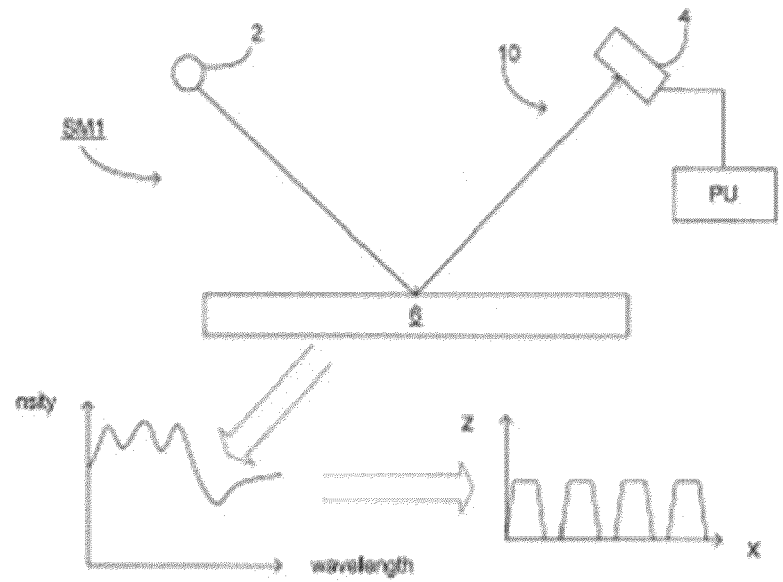
FIG. 4 depicts a schematic diagram of a scatterometer.

A metrology apparatus, such as a scatterometer, is depicted in FIG. 4. It comprises a broadband (white light)

radiation projector 2 which projects radiation onto a substrate 6. The reflected or scattered radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 5:
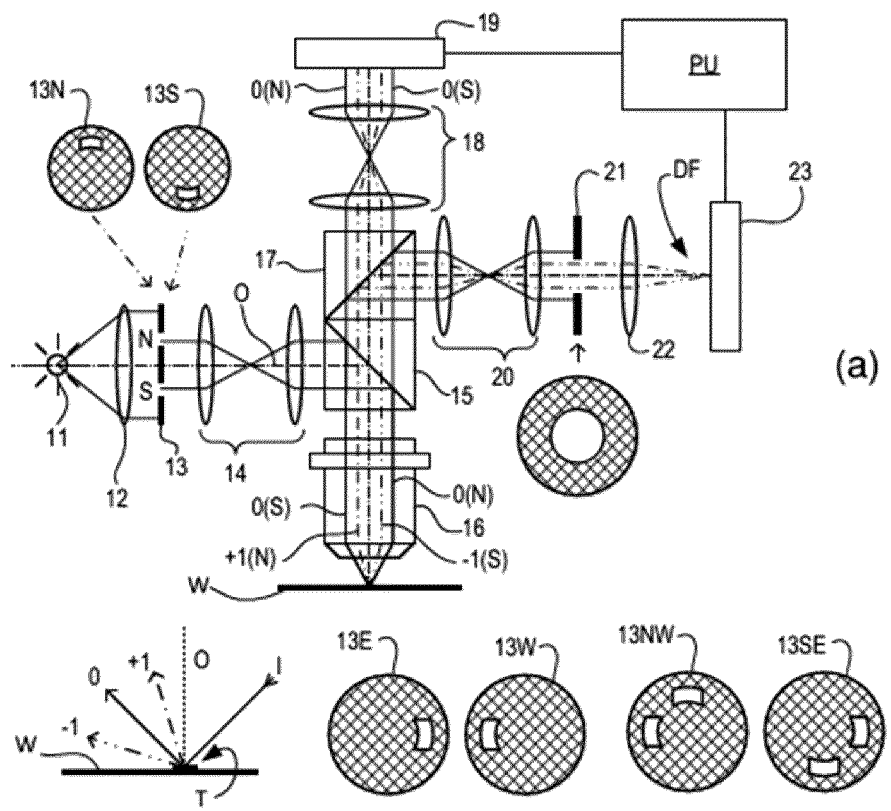
FIG. 5 comprises (a) a schematic diagram of a dark field scatterometer for use in measuring targets according to embodiments of the invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures.

FIG. 5(*a*) presents an embodiment of a metrology apparatus and, more specifically, a dark field scatterometer. A target T and diffracted rays of measurement radiation used to illuminate the target are illustrated in more detail in FIG. 5(*b*). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 5(*b*), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 5(*a*) and 3(*b*) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 5(*a*), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 5 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 5) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 5(*c*) and (*d*). The use of these, and numerous other variations and applications of the apparatus are described in prior published applications, mentioned above.

A topography measurement system, level sensor or height sensor, and which may be integrated in the lithographic apparatus, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 6:
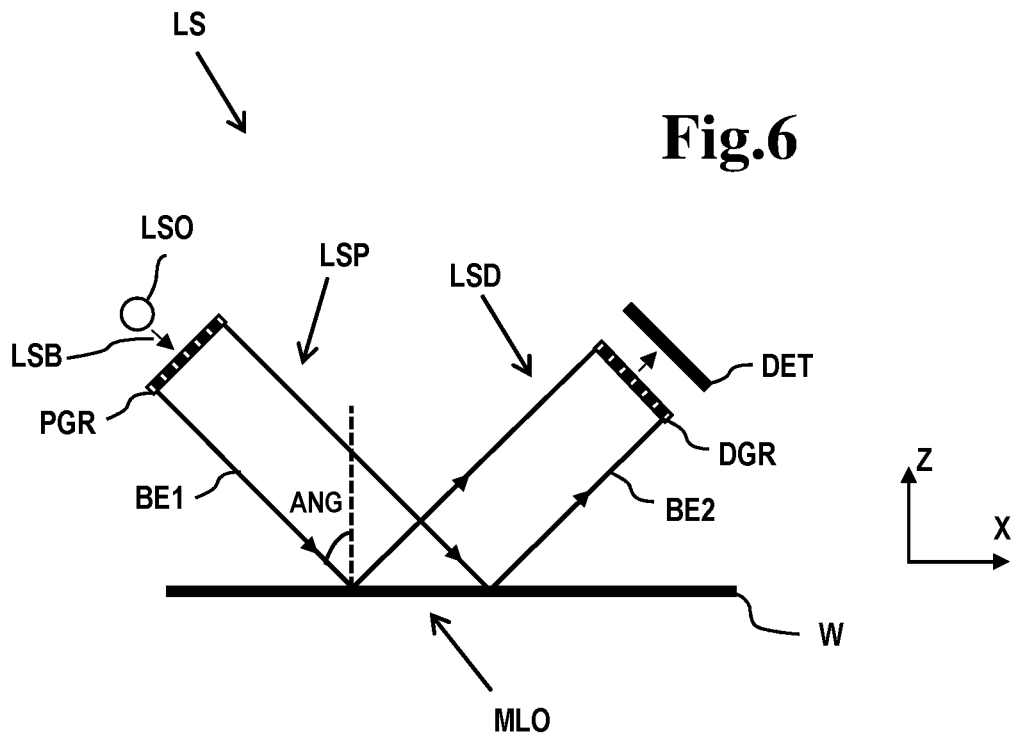
FIG. 6 depicts a schematic overview of a level sensor.

An example of a level or height sensor LS as known in the art is schematically shown in FIG. 6, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband radiation source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, both incorporated by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 7:
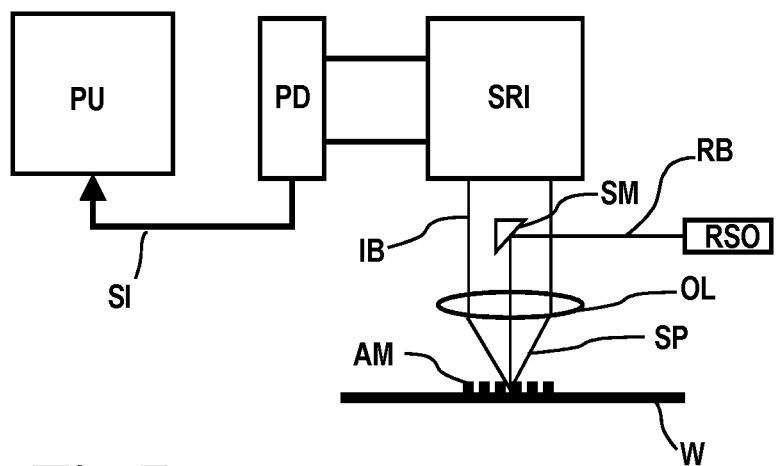
FIG. 7 depicts a schematic overview of an alignment sensor.

FIG. 7 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

Metrology tools MT, such as a scatterometer, topography measurement system, or position measurement system mentioned above may use radiation originating from a radiation source to perform a measurement. The properties of the radiation used by a metrology tool may affect the type and quality of measurements that may be performed. For some applications, it may be advantageous to use multiple radiation frequencies to measure a substrate, for example broadband radiation may be used. Multiple different frequencies may be able to propagate, irradiate, and scatter off a metrology target with no or minimal interference with other frequencies. Therefore different frequencies may for example be used to obtain more metrology data simultaneously. Different radiation frequencies may also be able to interrogate and discover different properties of a metrology target. Broadband radiation may be useful in metrology systems MT such as for example level sensors, alignment mark measurement systems, scatterometry tools, or inspection tools. A broadband radiation source may be a supercontinuum source.

High quality broadband radiation, for example supercontinuum radiation, may be difficult to generate. One method for generating broadband radiation may be to broaden high-power narrow band or single frequency input radiation, for example making use of non-linear, higher order effects. The input radiation (which may be produced using a laser) may be referred to as pump radiation. Alternatively, the input radiation may be referred to as seed radiation. To obtain high power radiation for broadening effects, radiation may be confined into a small area so that strongly localised high intensity radiation is achieved. In those areas, the radiation may interact with broadening structures and/or materials forming a non-linear medium so as to create broadband output radiation. In the high intensity radiation areas, different materials and/or structures may be used to enable and/or improve radiation broadening by providing a suitable non-linear medium.

In some implementations, as discussed further below with reference to FIG. 9, methods and apparatus for broadening input radiation may use a fibre for confining input radiation, and for broadening the input radiation to output broadband radiation. The fibre may be a hollow core fibre, and may comprise internal structures to achieve effective guiding and confinement of radiation in the fibre. The fibre may be a hollow core photonic crystal fibre (HC-PCF), which is particularly suitable for strong radiation confinement, predominantly inside the hollow core of the fibre, achieving high radiation intensities. The hollow core of the fibre may be filled with a gas acting as a broadening medium for broadening input radiation. Such a fibre and gas arrangement may be used to create a supercontinuum radiation source. Radiation input to the fibre may be electromagnetic radiation, for example radiation in one or more of the infrared, visible, UV, and extreme UV spectra. The output radiation may consist of or comprise broadband radiation, which may be referred to herein as white light.

Some embodiments relate to a new design of such a broadband radiation source comprising an optical fibre. The optical fibre is a hollow-core, photonic crystal fibre (HC-PCF). In particular, the optical fibre may be a hollow-core, photonic crystal fibre of a type comprising anti-resonant structures for confinement of radiation. Such fibres comprising anti-resonant structures are known in the art as anti-resonant fibres, tubular fibres, single-ring fibres, negative curvature fibres or inhibited coupling fibres. Various different designs of such fibres are known in the art. Alternatively, the optical fibre may be photonic bandgap fibres (HC-PBFs, for example a Kagome fibre).

A number of types of HC-PCFs can be engineered, each based on a different physical guidance mechanism. Two such HC-PCFs include: hollow-core photonic bandgap fibres (HC-PBFs) and hollow-core anti-resonant reflecting fibres (HC-ARFs). Detail on the design and manufacture of HC-PCFs can be found in US patent US2004/015085A1 (for HC-PBFs) and International PCT patent application WO2017/032454A1 (for Hollow Core anti-resonant reflecting fibres), which are incorporated herein by reference. FIG. 10(a) shows a Kagome fibre, comprising a Kagome lattice structure.

Figure 8:
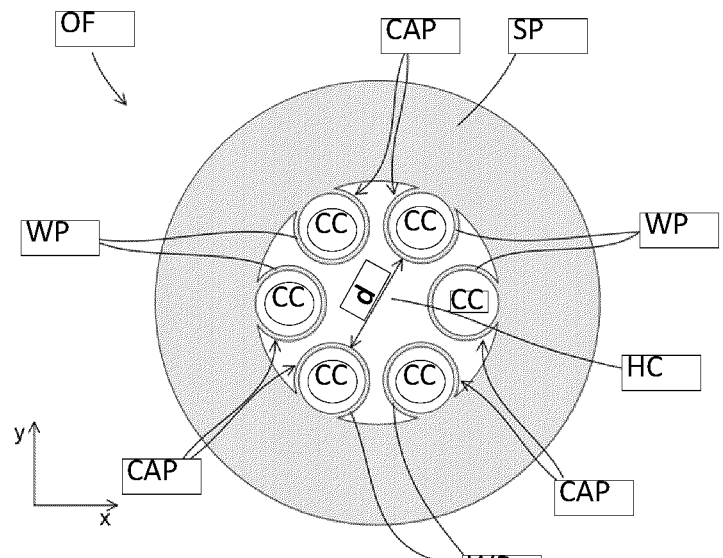
FIG. 8 is a schematic cross sectional view of a hollow core optical fibre that may form part of a radiation source according to an embodiment in a transverse plane (i.e. perpendicular to an axis of the optical fibre)

An example of an optical fibre for use in the radiation source is now described with reference to FIG. 8, which is a schematic cross sectional view of the optical fibre OF in a transverse plane. Further embodiments similar to the practical example of the fibre of FIG. 8 are disclosed in WO2017/032454A1.

The optical fibre OF comprises an elongate body, which is longer in one dimension compared to the other two dimensions of the fibre OF. This longer dimension may be referred to as an axial direction and may define an axis of the optical fibre OF. The two other dimensions define a plane which may be referred to as a transverse plane. FIG. 8 shows a cross-section of the optical fibre OF in this transverse plane (i.e. perpendicular to the axis), which is labelled as the x-y plane. The transverse cross-section of the optical fibre OF may be substantially constant along the fibre axis.

It will be appreciated that the optical fibre OF has some degree of flexibility and therefore the direction of the axis will not, in general, be uniform along the length of the optical fibre OF. The terms such as the optical axis, the transverse cross-section and the like will be understood to mean the local optical axis, the local transverse cross-section and so on. Furthermore, where components are described as being cylindrical or tubular these terms will be understood to encompass such shapes that may have been distorted as the optical fibre OF is flexed.

The optical fibre OF may have any length and it will be appreciated that the length of the optical fibre OF may be dependent on the application. The optical fibre OF may have a length between 1 cm and 10 m, for example, the optical fibre OF may have a length between 10 cm and 100 cm.

The optical fibre OF comprises: a hollow core COR; a cladding portion surrounding the hollow core COR; and a support portion SP surrounding and supporting the cladding portion. The optical fibre OF may be considered to comprise a body (comprising the cladding portion and the support portion SP) having a hollow core COR. The cladding portion comprises a plurality of anti-resonance elements for guiding radiation through the hollow core COR. In particular, the plurality of anti-resonance elements are arranged to confine radiation that propagates through the optical fibre OF predominantly inside the hollow core HC and to guide the radiation along the optical fibre OF. The hollow core HC of the optical fibre OF may be disposed substantially in a central region of the optical fibre OF, so that the axis of the optical fibre OF may also define an axis of the hollow core HC of the optical fibre OF.

The cladding portion comprises a plurality of anti-resonance elements for guiding radiation propagating through the optical fibre OF. In particular, in this embodiment, the cladding portion comprises a single ring of six tubular capillaries CAP. Each of the tubular capillaries CAP acts as an anti-resonance element.

The capillaries CAP may also be referred to as tubes. The capillaries CAP may be circular in cross section, or may have another shape. Each capillary CAP comprises a generally cylindrical wall portion WP that at least partially defines the hollow core HC of the optical fibre OF and separates the hollow core HC from a capillary cavity CC. It will be appreciated that the wall portion WP may act as an anti-reflecting Fabry-Perot resonator for radiation that propagates through the hollow core HC (and which may be incident on the wall portion WP at a grazing incidence angle). The thickness of the wall portion WP may be suitable so as to ensure that reflection back into the hollow core HC is generally enhanced whereas transmission into the capillary cavity CC is generally suppressed. In some embodiments, the capillary wall portion WP may have a thickness between 0.01-10.0 μm.

It will be appreciated that, as used herein, the term cladding portion is intended to mean a portion of the optical fibre OF for guiding radiation propagating through the optical fibre OF (i.e. the capillaries CAP which confine said radiation within the hollow core COR). The radiation may be confined in the form of transverse modes, propagating along the fibre axis.

The support portion is generally tubular and supports the six capillaries CAP of the cladding portion. The six capillaries CAP are distributed evenly around an inner surface if the inner support portion SP. The six capillaries CAP may be described as being disposed in a generally hexagonal formation.

The capillaries CAP are arranged so that each capillary is not in contact with any of the other capillaries CAP. Each of the capillaries CAP is in contact with the inner support portion SP and spaced apart from adjacent capillaries CAP in the ring structure. Such an arrangement may be beneficial since it may increase a transmission bandwidth of the optical fibre OF (relative, for example, to an arrangement wherein the capillaries are in contact with each other). Alternatively, in some embodiments, each of the capillaries CAP may be in contact with adjacent capillaries CAP in the ring structure.

The six capillaries CAP of the cladding portion are disposed in a ring structure around the hollow core COR. An inner surface of the ring structure of capillaries CAP at least partially defines the hollow core HC of the optical fibre OF. The diameter d of the hollow core HC (which may be defined as the smallest dimension between opposed capillaries, indicated by arrow d) may be between and 1000 μm. The diameter d of the hollow core HC may affect the mode field diameter, impact loss, dispersion, modal plurality, and non-linearity properties of the hollow core optical fibre OF.

In this embodiment, the cladding portion comprises a single ring arrangement of capillaries CAP (which act as anti-resonance elements). Therefore, a line in any radial direction from a center of the hollow core HC to an exterior of the optical fibre OF passes through no more than one capillary CAP.

It will be appreciated that other embodiments may be provided with different arrangements of anti-resonance elements. These may include arrangements having multiple rings of anti-resonance elements and arrangements having nested anti-resonance elements. Furthermore, although the embodiment shown in FIG. 8 comprises a ring of six capillaries, in other embodiments, one or more rings comprising any number of anti-resonance elements (for example 4, 5, 6, 7, 8, 9, 10, 11 or 12 capillaries) may be provided in the cladding portion.

FIG. 10(b) shows a modified embodiment of the above discussed HC-PCFs with a single ring of tubular capillaries. In the example of FIG. 10(b) there are two coaxial rings of tubular capillaries. For holding the inner and outer rings of tubular capillaries, a support tube ST may be included in the HC-PCF. The support tube may be made of silica.

Figure 10:
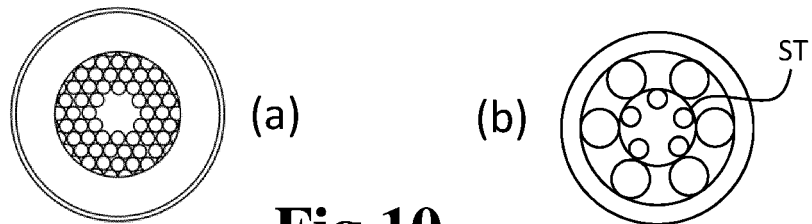
FIGS. 10 (*a*) and (*b*) schematically depict the transverse cross-sections of examples of hollow core photonic crystal fibre (HC-PCF) designs for supercontinuum generation.

The tubular capillaries of the examples of FIG. 8 and FIGS. 10 (a) and (b) may have a circular cross-sectional shape. Other shapes are also possible for the tubular capillaries, like elliptical or polygonal cross-sections. Additionally, the solid material of the tubular capillaries of the examples of FIG. 8 and FIGS. 10 (a) and (b) may comprise plastic material, like PMA, glass, like silica, or soft glass.

Figure 9:
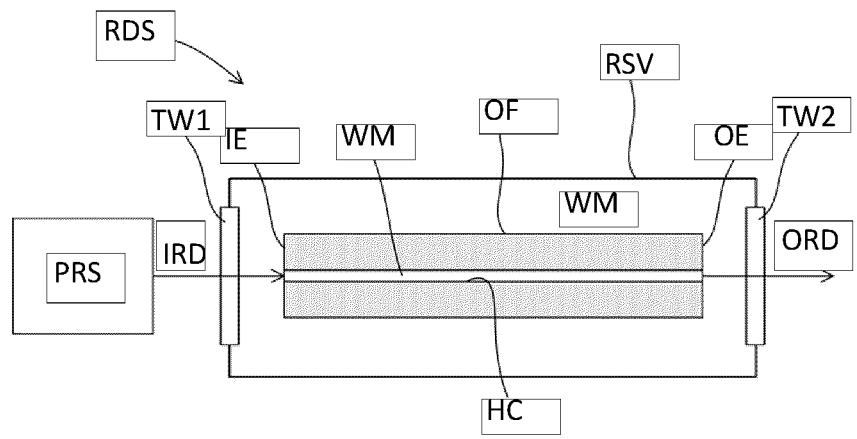
FIG. 9 depicts a schematic representation of a radiation source according to an embodiment for providing broadband output radiation.

FIG. 9 depicts a radiation source RDS for providing broadband output radiation. The radiation source RDS comprises a pulsed pump radiation source PRS or any other type of source that is capable of generating short pulses of a desired length and energy level; an optical fibre OF (for example of the type shown in FIG. 8) with a hollow core COR; and a working medium WM (for example a gas) disposed within the hollow core COR. Although in FIG. 9 the radiation source RDS comprises the optical fibre OF shown in FIG. 8, in alternative embodiments other types of hollow core optical fibre may be used.

The pulsed pump radiation source PRS is configured to provide input radiation IRD. The hollow core HC of the optical fibre OF is arranged to receive the input radiation IRD from the pulsed pump radiation source PRS, and broaden it to provide output radiation ORD. The working medium WM enables the broadening of the frequency range of the received input radiation IRD so as to provide broadband output radiation ORD.

The radiation source RDS further comprises a reservoir RSV. The optical fibre OF is disposed inside the reservoir RSV. The reservoir RSV may also be referred to as a housing, container or gas cell. The reservoir RSV is configured to contain the working medium WM. The reservoir RSV may comprise one or more features, known in the art, for controlling, regulating, and/or monitoring the composition of the working medium WM (which may be a gas) inside the reservoir RSV. The reservoir RSV may comprise a first transparent window TW1. In use, the optical fibre OF is disposed inside the reservoir RSV such that the first transparent window TW1 is located proximate to an input end IE of the optical fibre OF. The first transparent window TW1 may form part of a wall of the reservoir RSV. The first transparent window TW1 may be transparent for at least the received input radiation frequencies, so that received input radiation IRD (or at least a large portion thereof) may be coupled into the optical fibre OF located inside reservoir RSV. It will be appreciated that optics (not shown) may be provided for coupling the input radiation IRD into the optical fibre OF.

The reservoir RSV comprises a second transparent window TW2, forming part of a wall of the reservoir RSV. In use, when the optical fibre OF is disposed inside the reservoir RSV, the second transparent window TW2 is located proximate to an output end OE of the optical fibre OF. The second transparent window TW2 may be transparent for at least the frequencies of the broadband output radiation ORD of the apparatus 120.

Alternatively, in another embodiment, the two opposed ends of the optical fibre OF may be placed inside different reservoirs. The optical fibre OF may comprise a first end section configured to receive input radiation IRD, and a second end section for outputting broadband output radiation ORD. The first end section may be placed inside a first reservoir, comprising a working medium WM. The second end section may be placed inside a second reservoir, wherein the second reservoir may also comprise a working medium WM. The functioning of the reservoirs may be as described in relation to FIG. 9 above. The first reservoir may comprise a first transparent window, configured to be transparent for input radiation IRD. The second reservoir may comprise a second transparent window configured to be transparent for broadband output broadband radiation ORD. The first and second reservoirs may also comprise a sealable opening to permit the optical fibre OF to be placed partially inside and partially outside the reservoir, so that a gas can be sealed inside the reservoir. The optical fibre OF may further comprise a middle section not contained inside a reservoir. Such an arrangement using two separate gas reservoirs may be particularly convenient for embodiments wherein the optical fibre OF is relatively long (for example when the length is more than 1 m). It will be appreciated that for such arrangements which use two separate gas reservoirs, the two reservoirs (which may comprise one or more features, known in the art, for controlling, regulating, and/or monitoring the composition of a gas inside the two reservoirs) may be considered to provide an apparatus for providing the working medium WM within the hollow core HC of the optical fibre OF.

In this context a window may be transparent for a frequency if at least 50%, 75%, 85%, 90%, 95%, or 99% of incident radiation of that frequency on the window is transmitted through the window.

Both the first TW1 and the second TW2 transparent windows may form an airtight seal within the walls of the reservoir RSV so that the working medium WM (which may be a gas) may be contained within the reservoir RSV. It will be appreciated that the gas WM may be contained within the reservoir RSV at a pressure different to the ambient pressure of the reservoir RSV.

The working medium WM may comprise a noble gas such as Argon, Krypton, and Xenon, a Raman active gas such as Hydrogen, Deuterium and Nitrogen, or a gas mixture such as an Argon/Hydrogen mixture, a Xenon/Deuterium mixture, a Krypton/Nitrogen mixture, or a Nitrogen/Hydrogen mixture. Depending on the type of filling gas, the nonlinear optical processes can include modulational instability (MI), soliton fission, Kerr effect, Raman effect and dispersive wave generation, details of which are described in WO2018/127266A1 and U.S. Pat. No. 9,160,137B1 (both of which are hereby incorporated by reference). Since the dispersion of the filling gas can be tuned by varying the working medium WM pressure in the reservoir RSR (i.e. gas cell pressure), the generated broadband pulse dynamics and the associated spectral broadening characteristics can be adjusted so as to optimize the frequency conversion In one implementation, the working medium WM may be disposed within the hollow core HC at least during receipt of input radiation IRD for producing broadband output radiation ORD. It will be appreciated that, while the optical fibre OF is not receiving input radiation IRD for producing broadband output radiation, the gas WM may be wholly or partially absent from the hollow core COR.

In order to achieve frequency broadening high intensity radiation may be desirable. An advantage of having a hollow core optical fibre OF is that it may achieve high intensity radiation through strong spatial confinement of radiation propagating through the optical fibre OF, achieving high localised radiation intensities. The radiation intensity inside the optical fibre OF may be high, for example due to high received input radiation intensity and/or due to strong spatial confinement of the radiation inside the optical fibre OF. An advantage of hollow core optical fibres is that they can guide radiation having a broader wavelength range that solid-core fibres and, in particular, hollow core optical fibres can guide radiation in both the ultraviolet and infrared ranges.

An advantage of using a hollow core optical fibre OF may be that the majority of the radiation guided inside the optical fibre OF is confined to the hollow core COR. Therefore, the majority of the interaction of the radiation inside the optical fibre OF is with the working medium WM, which is provided inside the hollow core HC of the optical fibre OF. As a result, the broadening effects of the working medium WM on the radiation may be increased.

The received input radiation IRD may be electromagnetic radiation. The input radiation IRD may be received as pulsed radiation. For example, the input radiation IRD may comprise ultrafast pulses, for example, generated by a laser.

The input radiation IRD may be coherent radiation. The input radiation IRD may be collimated radiation, an advantage of which may be to facilitate and improve the efficiency of coupling the input radiation IRD into the optical fibre OF. The input radiation IRD may comprise a single frequency, or a narrow range of frequencies. The input radiation IRD may be generated by a laser. Similarly, the output radiation ORD may be collimated and/or may be coherent.

The broadband range of the output radiation ORD may be a continuous range, comprising a continuous range of radiation frequencies. The output radiation ORD may comprise supercontinuum radiation. Continuous radiation may be beneficial for use in a number of applications, for example in metrology applications. For example, the continuous range of frequencies may be used to interrogate a large number of properties. The continuous range of frequencies may for example be used to determine and/or eliminate a frequency dependency of a measured property. Supercontinuum output radiation ORD may comprise for example electromagnetic radiation over a wavelength range of 100 nm-4000 nm. The broadband output radiation ORD frequency range may be for example 400 nm-900 nm, 500 nm-900 nm, or 200 nm-2000 nm. The supercontinuum output radiation ORD may comprise white light.

The input radiation IRD provided by the pulsed pump radiation source PRS may be pulsed. The input radiation IRD may comprise electromagnetic radiation of one or more frequencies between 200 nm and 2 µm. The input radiation IRD may for example comprise electromagnetic radiation with a wavelength of 1.03 µm. The repetition rate of the pulsed radiation IRD may be of an order of magnitude of 1 kHz to 100 MHz. The pulse energies may have an order of magnitude of 0.1 µJ to 100 µJ, for example 1-10 µJ. A pulse duration for the input radiation IRD may be between 10 fs and 10 ps, for example 300 fs. The average power of input radiation IRD may be between 100 mW to several 100 W. The average power of input radiation IRD may for example be 20-50 W.

The pulsed pump radiation source PRS may be a laser. The spatio-temporal transmission characteristics of such a laser pulse, e.g. its spectral amplitude and phase, transmitted along the optical fibre OF can be varied and tuned through adjustment of (pump) laser parameters, working component WM variations, and optical fibre OF parameters. Said spatio-temporal transmission characteristics may include one or more of: output power, output mode profile, output temporal profile, width of the output temporal profile (or output pulse width), output spectral profile, and bandwidth of the output spectral profile (or output spectral bandwidth). Said pulse pump radiation source PRS parameters may include one or more of: pump wavelength, pump pulse energy, pump pulse width, pump pulse repetition rate. Said optical fibre OF parameters may include one or more of: optical fibre length, size and shape of the hollow core 101, size and shape of the capillaries, thickness of the walls of the capillaries surrounding the hollow core. Said working component WM, e.g. filling gas, parameters may include one or more of: gas type, gas pressure and gas temperature.

The broadband output radiation ORD provided by the radiation source RDS may have an average output power of at least 1 W. The average output power may be at least 5 W. The average output power may be at least 10 W. The broadband output radiation ORD may be pulsed broadband output radiation ORD. The broadband output radiation ORD may have a power spectral density in the entire wavelength band of the output radiation of at least 0.01 mW/nm. The power spectral density in the entire wavelength band of the broadband output radiation may be at least 3 mW/nm.

Figure 11:
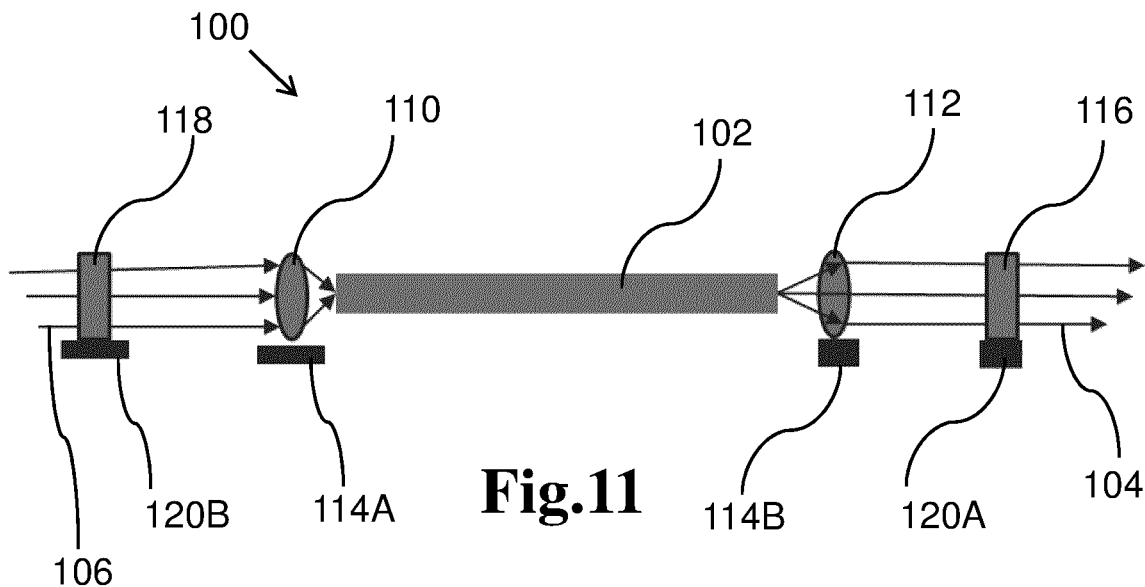
FIG. 11 depicts a schematic overview of an assembly including a hollow core photonic crystal fibre (HC-PCF) according to an embodiment of the present invention.

FIG. 11 shows an assembly 100 including a hollow core photonic crystal fibre (HC-PCF) 102 which is configured to generate broadband radiation 104 from input radiation 106 coupled into the HC-PCF 102. The input radiation 106 enters the HC-PCF 102 from the left hand side and exits the HC-PCF 102 from the right hand side in FIG. 11, but it will be appreciated that this is just an example. The HC-PCF 102 broadens the wavelength spectrum of the input radiation 106 to provide the broadband output radiation 104. This broadening is due to non-linear effects. The HC-PCF 102 is an example of a non-linear element. It will be appreciated that, in other embodiments, the assembly may comprise a different non-linear element. For example, the non-linear element may be a fused silica fibre or a glass plate.

The input radiation 106 may be provided by a pump laser (not shown) with a particular power, i.e. the input radiation 106 may be considered to be pump radiation. The input radiation 106 may comprise a single wavelength, a plurality of discrete wavelengths, or a narrowband wavelength range. The broadband radiation 104 may be referred to as the signal, i.e. the signal is any wavelength generated in the HC-PCF except the pump wavelength or wavelengths.

The assembly 100 includes a first lens 110 (lens element) positioned upstream of the HC-PCF 102, i.e. in the direction of the pump laser providing the input radiation 106 to the HC-PCF 102. This is the left side of the HC-PCF 102 in FIG. 11. The first lens 110 is configured to focus input radiation 106 into the HC-PCF 102.

The assembly 100 includes a second lens 112 (lens element) positioned downstream of the HC-PCF 102, i.e. in the direction that the broadband radiation 104 is provided from the HC-PCF 102. This is the right side of the HC-PCF 102 in FIG. 11. The second lens 112 is configured to substantially collimate radiation exiting the HC-PCF 102.

The first lens 110 and second lens 112 may be made of glass and/or may have a coating or coatings.

A first lens actuator 114A associated with the first lens 110 is provided to enable the input radiation 106 to enter the HC-PCF 102. This is because the diameter of the core of the HC-PCF 102 may be below 50 μm and the input radiation beam needs to be positioned at a ~μm accuracy level manoeuvred to be properly coupled into the core of the HC-PCF 102. That is, the first lens actuator 114A may adjust the position of the first lens 110 such that the input radiation enters the HC-PCF 102 properly.

The assembly 100 includes an optical element positioned downstream of the HC-PCF 102. In this embodiment, the optical element is a transmission element located at the right hand side of the HC-PCF 102 as shown in FIG. 11 and will be referred to as transmission element right (TER) 116.

Figure 12A:
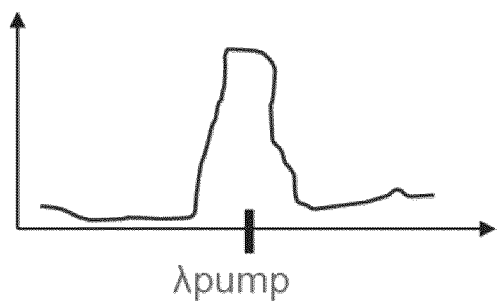
FIG. 12*a* depicts a graph showing the reflection from an downstream optical element in the assembly according to the embodiment of the present invention.

The TER 116 is configured to reflect at least some or all radiation at or near the wavelength or wavelengths of the input radiation 106. This is illustrated in FIG. 12a which is a graph showing the reflection from the TER 116. The graph shows wavelength (λ) (x-axis) against intensity (y-axis) for the reflected radiation. It can be seen that there is a peak in intensity at the wavelength of the input radiation (or λpump) and there is relatively little reflection for other wavelengths around this peak. In other words, the TER 116 reflects input radiation 106.

The broadband radiation 104 may be considered to comprise the input radiation 106. The TER 116 may be considered to reflect a fraction of the broadband radiation 104 which, in this embodiment, is the input radiation 106. That is, the fraction of the broadband radiation 104 is the radiation at or near the wavelength or wavelengths of the input radiation 106. The TER 116 may be configured to reflect between 90% and 100% of the radiation at or near the wavelength or wavelengths of the input radiation 106.

In some embodiments, the reflected input radiation 106 may be subject to pulse compression.

The TER 116 may be configured to transmit at least some or all broadband radiation 104. That is, the TER 116 may transmit at least some or all radiation over all wavelengths except wavelengths of radiation at or near the wavelength or wavelengths of the input radiation 106. More particularly, the TER 116 may transmit between 90% to 100% of the broadband radiation, excluding the input radiation 106 which is reflected. In some embodiments, the TER 116 may transmit substantially 100% of the broadband radiation 104 excluding the fraction of the broadband radiation 104 reflected, which in this embodiment, corresponds to the input radiation 106.

The assembly 100 includes an upstream optical element positioned upstream of the HC-PCF 102. In this embodiment, the upstream optical element is a transmission element located at the left hand side of the HC-PCF 102 as shown in FIG. 11 and will be referred to as transmission element left (TEL) 118.

Figure 12B:
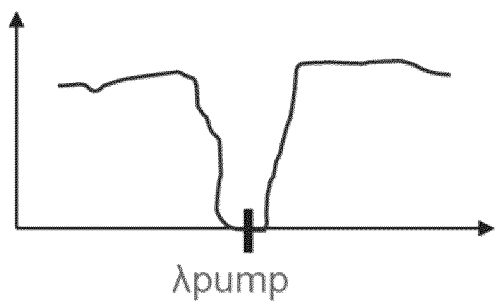
FIG. 12*b* depicts a graph showing the reflection from an upstream optical element in the assembly according to the embodiment of the present invention.

The TEL 118 is configured to reflect broadband radiation 104. This is illustrated in FIG. 12b which is a graph showing the reflection from the TEL 118. The graph shows wavelength (λ) (x-axis) against intensity (y-axis) for the reflected radiation. It can be seen that there is a dip in intensity at the wavelength of the input radiation (or λpump) and there is relatively large reflection for other wavelengths around this dip. In other words, the TEL 118 reflects radiation over all wavelengths except wavelengths of radiation at or near the wavelength or wavelengths of the input radiation 106. The TEL 118 may be configured to reflect between 90% and 100% of the broadband radiation 104.

The TEL 118 is configured to transmit input radiation 106. That is, the TEL 118 transmits radiation at or near the wavelength or wavelengths of the input radiation 106. More particularly, the TEL 118 may transmit between 90% to 100% of the input radiation 106.

The TER 116 and TEL 118 may be made from glass, metal, have a coating or coatings and/or have a mirror or partial mirror that carry out the reflections and transmissions. It will be appreciated that the TER 116 and TEL 118 may be made from any suitable material and have any suitable shape etc. to carry out the required reflections and transmissions.

In use, the input radiation 106 is produced by the pump laser, passes through the TEL 118 (from left to right in FIG. 11), is focused by the first lens 110 and enters the left hand side of the HC-PCF 102. The input radiation 106 is then broadened in the HC-PCF 102 and the broadband radiation 104 and un-depleted input radiation 106 exits the right hand side of the HC-PCF 102. The HC-PCF 102 generally guides the generated broadband radiation 104, or most of the generated broadband radiation 104, out of the right hand side of the HC-PCF 102. The un-depleted input radiation and the broadband radiation 104 is collimated by the second lens 112 and is incident on the TER 116.

The TER 116 may reflect the un-depleted input radiation 106, i.e. radiation at or near the wavelength or wavelengths of the input radiation 106, back to the HC-PCF 102. The second lens 112 will focus the reflected un-depleted input radiation 106 into the HC-PCF 102. The reflected un-depleted input radiation 106 will then generate further broadband radiation in the HC-PCF 102. in this case, the HC-PCF 102 generally guides the further generated broadband radiation 104, or most of the further generated broadband radiation 104, out of the left hand side of the HC-PCF 102.

The TER 116 transmits, in this case, the broadband radiation 104 coming from the HC-PCF 102. That is, the TER 116 may transmit radiation over all wavelengths except wavelengths of radiation at or near the wavelength or wavelengths of the input radiation 106.

A second lens actuator 114B associated with the second lens 112 is provided to enable the reflected un-depleted input radiation 106 to enter the HC-PCF 102. This is because the diameter of the core of the HC-PCF 102 may be below 50 μm and the un-depleted input radiation beam needs to be positioned at a ~um accuracy level to be properly coupled into the core of the HC-PCF 102. That is, the second lens actuator 114B may adjust the position of the second lens 112 such that the reflected un-depleted input radiation 106 enters the HC-PCF 102.

In addition, a first actuator 120A is provided with the TER 116 to enable the reflected un-depleted input radiation 106 to enter the HC-PCF 102. That is, the first actuator 120A may adjust the position of the TER 116 such that reflected input radiation 106 may enter the HC-PCF 102.

Broadband radiation 104 and un-depleted input radiation 106 also exits the left hand side of the HC-PCF, i.e. travels in the upstream direction. The broadband radiation 104 and the un-depleted input radiation 106 are collimated by the first lens 110 and is incident on the TEL 118.

The TEL 118 reflects the broadband radiation 104, i.e. radiation over all wavelengths except wavelengths of radiation at or near the wavelength or wavelengths of the input radiation 106, back to the HC-PCF 102. The first lens 110 will focus the reflected broadband radiation 104 into the HC-PCF 102. At least some of this reflected broadband radiation 104 will travel through the HC-PCF 102, exit out the right hand side of the HC-PCF 102 and be transmitted through the TER 116. This reflected broadband radiation 104 may also generate further broadband radiation in the HC-PCF 102.

The TEL 118 transmits the un-depleted input radiation 106 (i.e. unused pump radiation) which may have a relatively low intensity due to absorption after double-passing the HC-PCF 102.

A second actuator 120B is provided with the TEL 118 to enable the reflected broadband radiation 104 to enter the HC-PCF 102. That is, the second actuator 120B may adjust the position of the TEL 118 such that reflected broadband radiation 104 may enter the HC-PCF 102. The second actuator 120B may also be for enabling the input radiation 106 from the pump laser to enter the HC-PCF 102.

The broadband radiation 104, which may be supercontinuum radiation, that has passed through the TER 116 may be used for a variety of purposes, e.g. in metrology tools MT such as for example level sensors, alignment marks measurement systems, scatterometry tools, or inspection tools.

Reflecting the input radiation 106 back into the HC-PCF 102 provides an advantage of increasing the broadband radiation 104 generated from the same amount of input radiation 106. Reusing the input radiation twice will increase effective energy conversion efficiency which means the power of the pump laser may be reduced. Furthermore, reflecting the broadband radiation 104 back into the HC-PCF 102 also increases the broadband radiation 104 generated. In addition, passing the input radiation 106 through the HC-PCF 102 twice provides two broadband radiation pulses (i.e. double the rep-rate). This may increase the noise performance of the system since, the higher the frequency, the lower the noise levels. In some embodiments, there may be more than two pulses. Furthermore, in some embodiments, a pulse of a later radiation beam from the pump laser may be combined, or at least occur at the same time, as a pulse from an earlier input radiation beam from the pump laser. This may be due to the delay caused by a reflection. This may be dependent on the size (e.g. length) of components of the assembly, the distances between them and the frequency of the pump laser.

Increasing the amount of pump radiation being absorbed in the HC-PCF could be done by increasing the length of the fibre but this would require more space being taken up by the HC-PCF, which may not be desirable. Furthermore, manufacturing may be more difficult for a longer fibre and as properties may change along the length, there is more chance of non-uniformity with a longer fibre. In addition, a longer fibre may cost more than a shorter fibre. Alternatively, reflections could be added to send the pump back and reuse it. The reflections may be achieved by using Bragg gratings written into the fibre itself. However, this is not generally possible with a HC-PCF as the core of the fibre is hollow and thus there is no structure to provide the reflections. Although some of the structure HC-PCF may be used for reflections, this may be inefficient.

Another alternative may be to use e.g. three fibres in parallel such that light from a first fibre goes into a second fibre, and from the second fibre light goes into a third fibre. However, a draw-back of this alternative system may be that it would require three relatively expensive fibres, three times chance of contamination, three times alignment, and three times chance of any fibre failure.

In some embodiments, the optical element and the upstream optical element may be configured to reflect the fraction of the broadband radiation a plurality of times (e.g. 2, 3, 4 or 5 or more times) back into the HC-PCF. Passing radiation twice through the non-linear element may be preferable as passing more than twice may not provide much, if any gain in broadband radiation generation, e.g. due to loss from the radiation interacting with the components of the assembly.

In some embodiments, the assembly 100 may comprise a plurality of optical elements downstream of the HC-PCF 102 and/or a plurality of upstream optical elements upstream of the HC-PCF 102 to reflect the fraction of the broadband radiation back into the non-linear element.

Figure 13:
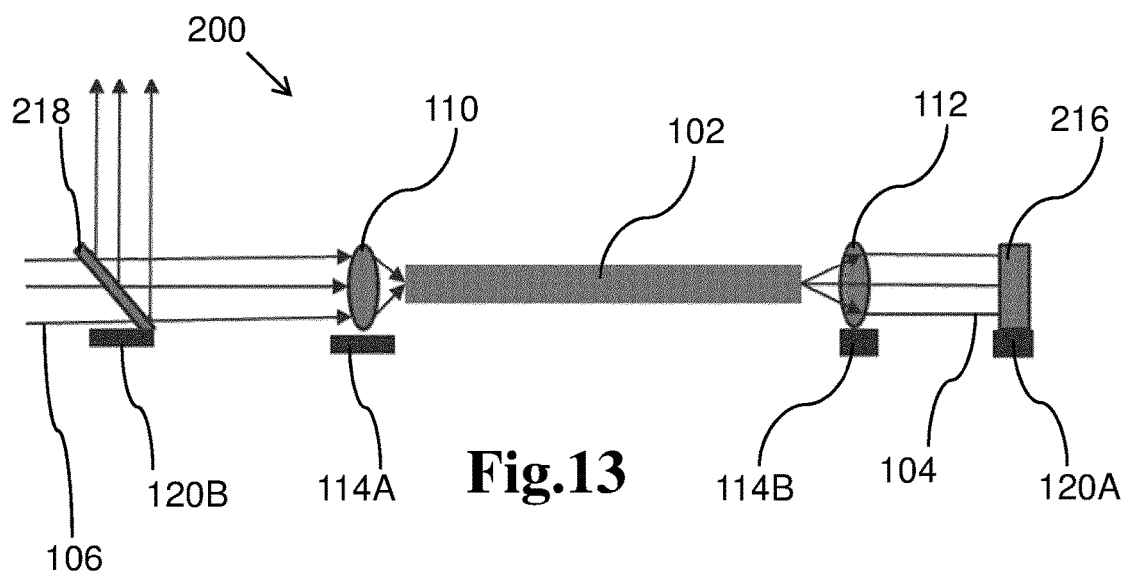
FIG. 13 depicts a schematic overview of an assembly including a hollow core photonic crystal fibre (HC-PCF) according to another embodiment of the present invention.

FIG. 13 shows another embodiment of an assembly 200 including a hollow core photonic crystal fibre (HC-PCF) 102 which is configured to generate broadband radiation 104 from input radiation 106 coupled into the HC-PCF 102.

The assembly 200 is similar to the assembly 100 of FIG. 11 (the same numerals have been used for the same components as in the previous embodiment and for conciseness they have not been discussed again here). However, in this embodiment, the optical element downstream of the HC-PCF 102 is a reflective element and will be referred to as reflective element right (RER) 216.

In this embodiment, the RER 216 reflects at least some broadband radiation 104 back into the HC-PCF 102. The RER 216 may reflect a majority of the broadband radiation 104 back into the HC-PCF 102. The majority of the broadband radiation 104 may comprise the (un-depleted) input radiation 106. The RER 216 may be configured to reflect at least some radiation at or near wavelengths desired to be output.

The RER 216 may be configured to reflect between 90% to 100% of the broadband radiation. It will be appreciated that, in embodiments, a fraction of the broadband radiation 104 may be considered to include the majority of the broadband radiation 104 and/or between 90% to 100% of the broadband radiation 104.

In other embodiments, the optical element may be a transmission element. For example, the optical element may transmit at least some of the un-depleted input radiation 106 which has exited the right hand side of the HC-PCF 102. In this case, the RER 216 may reflect radiation over all wavelengths, except wavelengths of radiation at or near the wavelength or wavelengths of the input radiation 106, back to the HC-PCF 102.

The reflected broadband radiation 104 may advantageously generate further broadband radiation in the HC-PCF 102. Broadband radiation 104 generated from the input radiation 106 initially in the HC-PCF 102 (i.e. during a first pass) may be at the stage that (non-linear) broadening process is still developing. The reflected broadband radiation 104 entering the HC-PCF 102 (i.e. during a second pass) then adds to this process, i.e. finishes the broadband radiation 104 generation. This may have an advantage of allowing shorter fibres to be used.

The assembly 200 comprises a supplementary optical element positioned upstream of the HC-PCF 102. The supplementary optical element is a transmission element located at the left hand side of the HC-PCF 102 as shown in FIG. 13 and will be referred to as supplementary transmission element left (STEL) 218.

The STEL 218 is configured to reflect at least some of the broadband radiation 104 off axis and transmit at least some of the radiation at or near the wavelength or wavelengths of the input radiation 106. That is, the STEL 218 reflects the broadband radiation 104 away from the HC-PCF 102 so that it may be used, e.g. in metrology tools MT such as for example level sensors, alignment marks measurement systems, scatterometry tools, or inspection tools. The STEL 218 may be configured to reflect between 90% to 100% of the broadband radiation 104.

In some embodiments, the RER may transmit some broadband radiation, e.g. up to 10% of the broadband radiation incident thereon. This means that there may be two broadband radiation beams, one transmitted through the RER and one reflected from the STEL. This may be considered to be tapping some light from the broadband radiation beam reflected from the STEL. For example, looking at the light from the broadband radiation beam transmitted through the RER may provide information on the main beam reflected from the STEL. The two beams may be synchronised.

Figure 14:
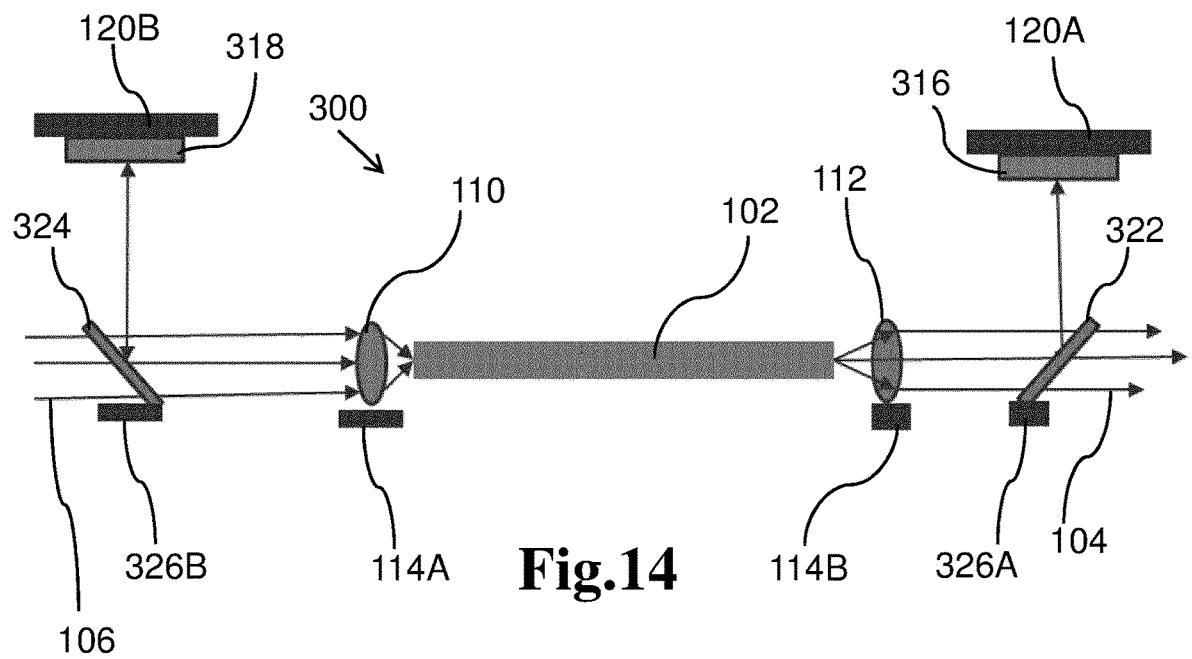
FIG. 14 depicts a schematic overview of an assembly including a hollow core photonic crystal fibre (HC-PCF) according to another embodiment of the present invention.

FIG. 14 shows another embodiment of an assembly 300 including a hollow core photonic crystal fibre (HC-PCF) 102 which is configured to generate broadband radiation 104 from input radiation 106 coupled into the HC-PCF 102. The assembly 300 is similar to the assembly 100 of FIG. 11 (the same numerals have been used for the same components as in embodiment of FIG. 11 and for conciseness they have not been discussed again here). However, the optical element downstream of the HC-PCF 102 is a reflective element and will be referred to as reflective element right (RER) 316. Furthermore, the upstream optical element which is upstream of the HC-PCF 102 is a reflective element and will be referred to as reflective element right (REL) 318.

In this embodiment, the RER 316 reflects at least some of the un-depleted input radiation 106 back towards the HC-PCF 102. The RER 316 may be configured to reflect between 90% to 100% of the un-depleted input radiation 106.

In this embodiment, the REL 318 reflects at least some broadband radiation 104 back towards the HC-PCF 102. The REL 318 may reflect a majority of the broadband radiation 104 back towards the HC-PCF 102. The majority of the broadband radiation 104 may comprise some of the (un-depleted) input radiation 106. The REL 318 may be configured to reflect between 90% to 100% of the broadband radiation 104.

The assembly 300 includes an additional optical element located downstream of the HC-PCF 102. In this embodiment, the additional optical element is a dichroic mirror and will be referred to as dichroic mirror right (DMR) 322. The DMR 322 is positioned between the HC-PCF 102 and the RER 316. The DMR 322 may be a band pass mirror. The DMR 322 may be made from glass, metal, have a coating or coatings and/or have a mirror or partial mirror that carries out reflections and transmissions.

The DMR 322 is configured to transmit at least some broadband radiation 104 and to reflect at least some radiation at or near the wavelength or wavelengths of the input radiation 106 to the RER 316 and back from the RER 316 into the HC-PCF 102. The DMR 322 may transmit between 90% and 100% of the broadband radiation 104 excluding the fraction of the broadband radiation 104 reflected. The DMR 322 may transmit substantially 100% of the broadband radiation 104 excluding the fraction of the broadband radiation 104 reflected. It will be appreciated that, in other embodiments, the additional optical element may be a different component from a dichroic mirror.

The assembly 300 includes an upstream additional optical element located upstream of the HC-PCF 102. In this embodiment, the upstream additional optical element is a dichroic mirror and will be referred to as dichroic mirror left (DML) 324. The DML 324 is positioned between the HC-PCF 102 and the REL 318. The DML 324 may be a band pass mirror. The DML 324 may be made from glass, metal, have a coating or coatings and/or have a mirror or partial mirror that carries out reflections and transmissions.

The DML 324 is configured to transmit at least some radiation at or near the wavelength or wavelengths of the input radiation 106 and reflect at least some broadband radiation to the REL 318 and back from the REL 318 into the HC-PCF 102. The DML 324 may reflect between 90% and 100% of the broadband radiation 104. It will be appreciated that, in other embodiments, the upstream additional optical element may be a different component from a dichroic mirror.

A third actuator 326A is provided with the DMR 322 to enable the reflected un-depleted input radiation 106 to enter the HC-PCF 102. That is, the third actuator 326A may adjust the position of the DMR 322 such that reflected un-depleted input radiation 106 may enter the HC-PCF 102.

A fourth actuator 326B is provided with the DML 324 to enable the reflected broadband radiation 104 to enter the HC-PCF 102. That is, the fourth actuator 326B may adjust the position of the DML 324 such that reflected broadband radiation 104 may enter the HC-PCF 102.

In embodiments, the RER 316 is configured to compress pulses of the radiation at or near the wavelength or wavelengths of the input radiation 106. That is, the RER 316 may be combined with a pulse compressing component. This is needed in case the intensity of the reflected un-depleted input radiation 106 is not sufficient to initiate the non-linear process generating the broadband radiation 104. The compression of the input radiation 106 may be by phase modulation. In embodiments, the RER 316 may comprise a chirped mirror, a grating pair, or a prism pair. This will allow the un-depleted input radiation 106 to be compressed before sending back to the HC-PCF 102 again for broadband generation. It will be appreciated that, in some embodiments, the pulse compressing component may be integral with the RER.

In embodiments, the REL 318 is configured to shape the pulses of the broadband radiation 104 incident thereon. The REL 318 may be configured to spectral filter the broadband radiation 104. That is, the REL 318 may be combined with a spectral filtering component. In embodiments, this may be e.g. a spectral filter or an acousto-optic tunable filter (AOTF). This may allow the spectral shape of the reflected broadband radiation 104 to be manipulated, and, in turn, the final white light (broadband radiation 104) spectral shape at the output (the right side of the HC-PCF 102) to be manipulated. It will be appreciated that, in some embodiments, the spectral filtering component may be integral with the REL. It will be appreciated that, in other embodiments, other components may shape the broadband radiation 104, such as components downstream of the HC-PCF.

The broadband radiation 104 may be manipulated based on the requirements of applications (e.g. if more flat pulse shape or more intensity in one wavelength is needed).

The spectral filtering components and/or pulse compressing components (more generally, dynamic elements) may be changed during operation. For example, one application may require a flat shape of the broadband radiation and thus the components may be changed accordingly. However, in another example. another application may require more intensity in say a blue light and so the component may be changed to provide this desired spectrum. The dynamic elements being able to be changed in this way provides flexibility for different applications, e.g. without having to change much of the assembly.

Generally, the non-linear elements generate light in an unpredictable way governed by the non-linear element itself and the quantum noise in the system. However, the average spectrum over many shots (e.g. tens, hundreds, thousands . . . ) are still characteristics of the configuration of the system (laser, fibre, and gas). Using the spectral filtering components on the REL 318 allows the average spectrum coming from the HC-PCF 102 to be influenced. Therefore, if, for example, the HC-PCF 102 is degrading its spectral performance, this can be compensated for or the spectrum can be modified. Compensating for or modifying the spectrum will not reduce the degradation which is mainly caused by the degradation of the fibre under high power laser irradiation. However, modifying the spectrum (e.g. by using the spectral filtering components on the REL 318) provides a way to compensate for the spectral change due to the fibre degradation.

Further embodiments are disclosed in the list of numbered clauses provided below:

1. An assembly comprising a non-linear element configured for generating broadband radiation from input radiation coupled into the non-linear element,
   wherein the assembly further comprises an optical element positioned downstream of the non-linear element configured to reflect a fraction of the broadband radiation back into the non-linear element.
2. The assembly according to clause 1, wherein the optical element is configured to reflect at least some radiation at or near the wavelength or wavelengths of the input radiation back into the non-linear element.
3. The assembly according to clause 2, wherein the optical element is configured to compress pulses of the at least some radiation at or near the wavelength or wavelengths of the input radiation.
4. The assembly according to either clause 2 or 3, wherein the optical element is configured to transmit at least some of the broadband radiation.
5. The assembly according to clause 4, wherein the optical element is configured to transmit between 90% to 100% of the broadband radiation excluding the fraction of the broadband radiation reflected.
6. The assembly according to either clause 2 or 3, wherein the assembly further comprises an additional optical element positioned between the non-linear optical element and the optical element, the additional optical element being configured to transmit at least some broadband radiation and to reflect at least some radiation at or near the wavelength or wavelengths of the input radiation to the optical element and back from the optical element into the non-linear optical element.
7. The assembly according to clause 6, wherein the additional optical element is configured to transmit between 90% and 100% of the broadband radiation excluding the fraction of the broadband radiation reflected.
8. The assembly according to clauses 2-7, wherein the optical element is configured to reflect between 90% and 100% of the radiation at or near the wavelength or wavelengths of the input radiation.
9. The assembly according to clause 1, wherein the optical element is configured to reflect a majority of the broadband radiation back into the non-linear element.
10. The assembly according to clause 9, wherein the optical element is configured to reflect between 90% to 100% of the broadband radiation.
11. The assembly according to either clause 9 or 10, wherein the assembly comprises a supplementary optical element positioned upstream of the non-linear element configured to reflect at least some broadband radiation off axis and transmit at least some of the radiation at or near the wavelength or wavelengths of the input radiation.
12. The assembly according to clauses 1-8, wherein the assembly comprises an upstream optical element positioned upstream of the non-linear element configured to reflect at least some of the broadband radiation back into the non-linear element.
13. The assembly according to clause 12, wherein the assembly comprises an upstream additional optical element positioned between the non-linear optical element and the upstream optical element, the upstream additional optical element being configured to transmit at least some radiation at or near the wavelength or wavelengths of the input radiation and to reflect at least some broadband radiation to the upstream optical element and back from the upstream optical element into the non-linear optical element.
14. The assembly according to clause 13, wherein the upstream optical element is configured to shape the broadband radiation.
15. The assembly according to clause 13 or 14, wherein the upstream optical element is configured to spectral filter the broadband radiation.
16. The assembly according to any preceding clause, wherein the assembly comprises a first lens and a second lens positioned upstream and downstream of the non-linear element respectively for focussing radiation into the non-linear element and providing substantially collimated radiation exiting the non-linear element.
17. The assembly according to any preceding clause, wherein the assembly comprises at least one actuator configured to move at least one of the optical element, the additional optical element, the upstream optical element, the upstream additional optical element, the supplementary optical element, the first lens and the second lens.
18. The assembly according to any preceding clause, wherein the non-linear element is a hollow core fibre.
19. The assembly according to clause 18, wherein the hollow core fibre is a photonic crystal fibre.
20. A metrology arrangement comprising an assembly according to any preceding clause.
21. A metrology apparatus comprising the metrology arrangement according to clause 19.
22. An inspection apparatus comprising the metrology arrangement according to clause 19.
23. A lithographic apparatus comprising the assembly according to clauses 1-19.
24. A lithographic apparatus comprising the metrology arrangement according to clause 20.
25. A method of generating broadband radiation from input radiation coupled into a non-linear element, the method comprising:
    reflecting a fraction of the broadband radiation back into the non-linear element from an optical element positioned downstream of the non-linear element.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An assembly comprising:
   a non-linear element configured to generate broadband radiation from input radiation coupled into the non-linear element, the broadband radiation comprising a continuous range of wavelengths; and
   an optical element positioned downstream of the non-linear element, the optical element configured to reflect a fraction of the broadband radiation back into an output end of the non-linear element,
   wherein the optical element is configured to reflect at least some radiation at or near the wavelength or wavelengths of the input radiation back into the non-linear element.

2. The assembly according to claim 1, wherein the optical element is configured to compress pulses of the at least some radiation at or near the wavelength or wavelengths of the input radiation.

3. The assembly according to claim 1, wherein the optical element is configured to transmit at least some of the broadband radiation.

4. The assembly according to claim 3, wherein the optical element is configured to transmit between 90% to 100% of the broadband radiation excluding the fraction of the broadband radiation reflected.

5. The assembly according to claim 1, further comprising an additional optical element positioned between the non-linear element and the optical element, the additional optical element configured to transmit at least some broadband radiation and to reflect at least some radiation at or near the wavelength or wavelengths of the input radiation to the optical element and back from the optical element into the non-linear element.

6. The assembly according to claim 5, wherein the additional optical element is configured to transmit between 90% and 100% of the broadband radiation excluding the fraction of the broadband radiation reflected by the additional optical element.

7. The assembly according to claim 1, wherein the optical element is configured to reflect between 90% and 100% of the radiation at or near the wavelength or wavelengths of the input radiation.

8. The assembly according to claim 1, wherein the optical element is configured to reflect a majority of the broadband radiation output from the non-linear element back into the non-linear element.

9. The assembly according to claim 8, wherein the optical element is configured to reflect between 90% to 100% of the broadband radiation.

10. The assembly according to claim 8, further comprising a supplementary optical element positioned upstream of the non-linear element and configured to reflect at least some broadband radiation off axis and to transmit at least some of the radiation at or near the wavelength or wavelengths of the input radiation.

11. The assembly according to claim 1, further comprising an upstream optical element positioned upstream of the non-linear element and configured to reflect at least some of the broadband radiation back into the non-linear element.

12. The assembly according to claim 11, further comprising an upstream additional optical element positioned between the non-linear element and the upstream optical element, the upstream additional optical element configured to transmit at least some radiation at or near the wavelength or wavelengths of the input radiation and to reflect at least some broadband radiation to the upstream optical element and back from the upstream optical element into the non-linear element.

13. The assembly according to claim 12, wherein the upstream optical element is configured to shape pulses of the broadband radiation.

14. The assembly according to claim 12, wherein the upstream optical element is configured to spectral filter the broadband radiation.

15. A metrology or inspection apparatus comprising:
    a detector; and
    the assembly according to claim 1.

16. A lithographic apparatus comprising the assembly according to claim 1.

17. A method of generating broadband radiation, the method comprising:
    coupling input radiation into a non-linear element configured to generate broadband radiation therein and to output the broadband radiation, the broadband radiation comprising a continuous range of wavelengths; and
    reflecting a majority of the broadband radiation back into an output end of the non-linear element from an optical element positioned downstream of the non-linear element.

18. The method of claim 17, further comprising reflecting at least some radiation at or near the wavelength or wavelengths of the input radiation back into the non-linear element.

19. An assembly comprising:
    a non-linear element configured to generate broadband radiation from input radiation coupled into the non-linear element; and
    an optical element positioned downstream of the non-linear element, the optical element configured to reflect a majority of the broadband radiation output from the non-linear element back into the non-linear element.

20. The assembly according to claim 19, wherein the optical element s configured to reflect between 90% to 100% of the broadband radiation.

21. The assembly according to claim 19 further comprising a supplementary optical element positioned upstream of the non-linear element and configured to reflect at least some broadband radiation off axis and to transmit at least some of the radiation at or near the wavelength or wavelengths of the input radiation.

* * * * *